(12) United States Patent
Doris et al.

(10) Patent No.: US 9,640,640 B1
(45) Date of Patent: May 2, 2017

(54) FINFET DEVICE WITH CHANNEL STRAIN

(71) Applicant: International Business Machines Corporation, Armonk, NY (US)

(72) Inventors: Bruce B. Doris, Slingerlands, NY (US); Hong He, Schenectady, NY (US); Sivananda K. Kanakasabapathy, Niskayuna, NY (US); Gauri Karve, Cohoes, NY (US); Fee Li Lie, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/135,850

(22) Filed: Apr. 22, 2016

Related U.S. Application Data

(62) Division of application No. 14/962,194, filed on Dec. 8, 2015, now Pat. No. 9,331,148.

(51) Int. Cl.
*H01L 29/66* (2006.01)
*H01L 29/78* (2006.01)
*H01L 21/225* (2006.01)

(52) U.S. Cl.
CPC .... *H01L 29/66795* (2013.01); *H01L 21/2253* (2013.01); *H01L 29/66545* (2013.01); *H01L 29/785* (2013.01); *H01L 29/7849* (2013.01)

(58) Field of Classification Search
CPC .......... H01L 29/1054; H01L 29/66545; H01L 29/66795; H01L 21/26506; H01L 21/823431; H01L 21/823821; H01L 21/845; H01L 27/0886; H01L 27/0924; H01L 27/10826; H01L 27/10879; H01L 27/1211; H01L 29/41791; H01L 29/66772
See application file for complete search history.

(56) References Cited

U.S. PATENT DOCUMENTS

| 9,331,148 B1 | 5/2016 | Doris et al. |
| 2014/0312393 A1* | 10/2014 | Rodder ............. H01L 29/66537 257/288 |
| 2015/0140756 A1* | 5/2015 | Yu ...................... H01L 29/66795 438/275 |

(Continued)

FOREIGN PATENT DOCUMENTS

CN 103187297 * 7/2013

OTHER PUBLICATIONS

The machine translation of the chinese patent Zhao (CN-103187297).*

(Continued)

*Primary Examiner* — Yasser A Abdelaziez
(74) *Attorney, Agent, or Firm* — Cantor Colburn LLP; Feb R. Cabrasawan

(57) ABSTRACT

A method for fabricating a semiconductor device, the method comprises forming a fin on a substrate, forming a dummy gate stack on the fin and the substrate, removing a portion of an exposed portion of the fin, forming a source/drain region on an exposed portion of the fin, forming a conductive contact on the source/drain region, removing the dummy gate stack to expose a channel region of the fin, implanting ions in the channel region of the fin, performing an annealing process, and forming a gate stack on the channel region of the fin.

9 Claims, 17 Drawing Sheets

(56) References Cited

U.S. PATENT DOCUMENTS

2015/0255543 A1* 9/2015 Cheng ................ H01L 29/7848
257/288

OTHER PUBLICATIONS

Bruce B. Doris, et al., "FinFET Device With Channel Strain", U.S. Appl. No. 15/135,844, filed Apr. 22, 2016.
List of IBM Patents or Patent Applications Treated as Related; (Appendix P), Filed Jun. 14, 2016, 2 pages.

* cited by examiner

FINFET DEVICE WITH CHANNEL STRAIN

DOMESTIC PRIORITY

This application is a Divisional of U.S. patent application Ser. No. 14/962,194, filed Dec. 8, 2015, the contents of which in its entirety are herein incorporated by reference.

BACKGROUND

The present invention generally relates to semiconductor devices, and more specifically, to finFET semiconductor devices.

Field effect transistors (FETs) are widely used in the electronics industry for switching, amplification, filtering, and other tasks related to both analog and digital electrical signals. Most common among these are metal-oxide-semiconductor field-effect transistors (MOSFET), in which a gate structure is energized to create an electric field in an underlying channel region of a semiconductor body, by which electrons are allowed to travel through the channel between a source region and a drain region of the semiconductor body. Complementary metal-oxide-semiconductor field-effect transistor, which are typically referred to as CMOS devices, have become widely used in the semiconductor industry. These CMOS devices include both n-type and p-type (NMOS and PMOS) transistors, and therefore promote the fabrication of logic and various other integrated circuitry.

The escalating demands for high density and performance associated with ultra large scale integrated (ULSI) circuit devices have required certain design features, such as shrinking gate lengths, high reliability and increased manufacturing throughput. The continued reduction of design features has challenged the limitations of conventional fabrication techniques. Three-dimensional semiconductor devices, such as fin-type semiconductor devices (referred to as finFETs), typically include dielectric gate spacers formed on sidewalls of the gate stack to isolate the gate stack from the adjacent source/drain (S/D) regions.

To increase the performance of FET devices, it is often desirable to induce a strain on the semiconductor material in the channel region of the devices. The strain is often induced in the semiconductor substrate material prior to forming the fins of the finFET devices.

SUMMARY

According to an embodiment of the present invention, a method for fabricating a semiconductor device, the method comprises forming a fin on a substrate, forming a dummy gate stack on the fin and the substrate, removing a portion of an exposed portion of the fin, forming a source/drain region on an exposed portion of the fin, forming a conductive contact on the source/drain region, removing the dummy gate stack to expose a channel region of the fin, implanting ions in the channel region of the fin, performing an annealing process, and forming a gate stack on the channel region of the fin.

According to another embodiment of the present invention, a method for fabricating a semiconductor device comprises forming a fin on a substrate, forming a dummy gate stack on the fin and the substrate, forming a source/drain region on an exposed portion of the fin, removing the dummy gate stack to expose a channel region of the fin, implanting ions in the channel region of the fin, performing an annealing process, and forming a gate stack on the channel region of the fin.

According to another embodiment of the present invention, a semiconductor device comprises a fin arranged on a substrate, a gate stack arranged over a channel region of the fin, wherein the channel region of the fin includes implanted germanium ions that are operative to induce a strain in the channel region of the fin, and a source/drain region arranged on the fin adjacent to the gate stack.

DETAILED DESCRIPTION

Figure 1:
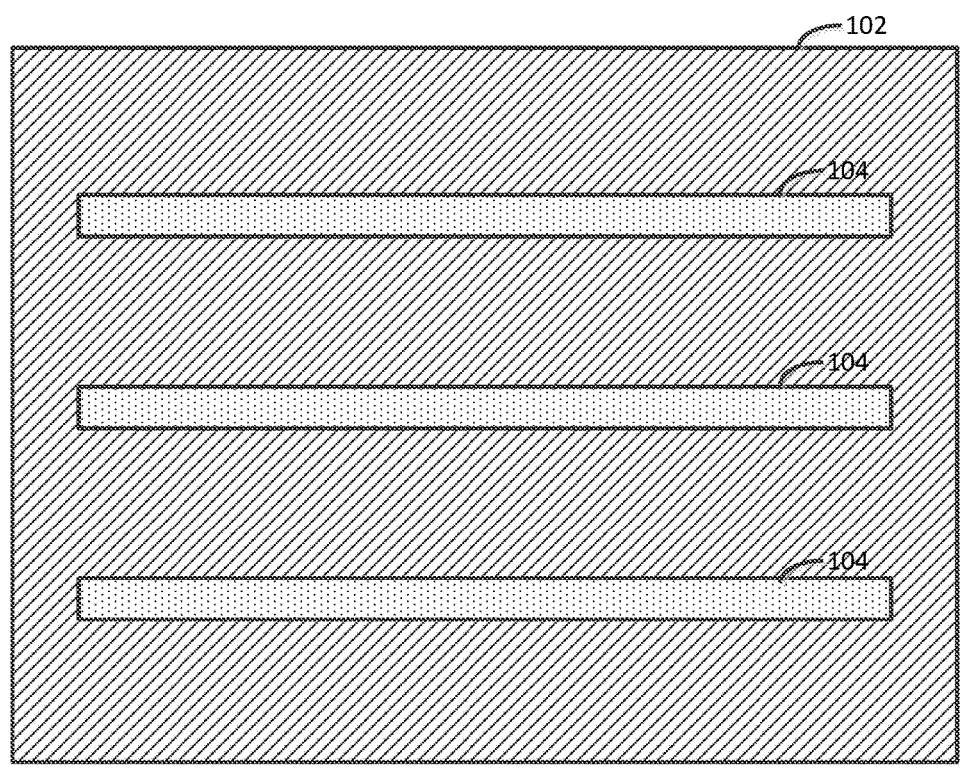
FIG. 1 illustrates a top view of semiconductor fins that have been patterned on a substrate.

As discussed above, it is often desirable to induce a strain in the channel regions of semiconductor devices. In typical fabrication, the strain is induced in a layer of semiconductor material and the strained layer of semiconductor material is patterned to form fins. During the patterning of the fins, and during subsequent processes such as, source/drain fabrication the strain of the fins in the channel region may be undesirably reduced (relaxed). The methods and resultant structures described herein provide for a finFET device having a strained channel region.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 illustrates a top view of semiconductor fins 104 that have been patterned on a substrate 102. From a semiconductor on insulator (SOI) wafer. An SOI wafer includes a layer of a semiconducting material atop an insulating layer (i.e., an oxide layer) which is in turn disposed on a silicon substrate. The semiconducting material can include, but is not limited to, Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

In the illustrated embodiment, the substrate 102 includes an insulator layer (buried oxide layer), however in alternate embodiments; a bulk silicon substrate may be used.

The fins 104 may be formed in the substrate 102 by depositing a hard mask (not shown) material over the semiconductor material layer. The fins 104 are patterned by, for example, sidewall imaging transfer, or another lithographic patterning and etching process such as reactive ion etching (RIE).

Figure 2:
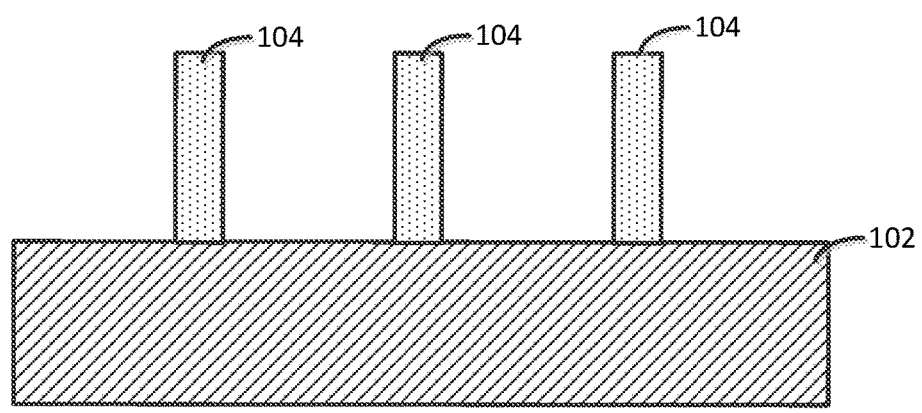
FIG. 2 illustrates a side view of the substrate and the fins arranged on the substrate.

FIG. 2 illustrates a side view of the substrate 102 and the fins 104 arranged on the substrate.

Figure 3:
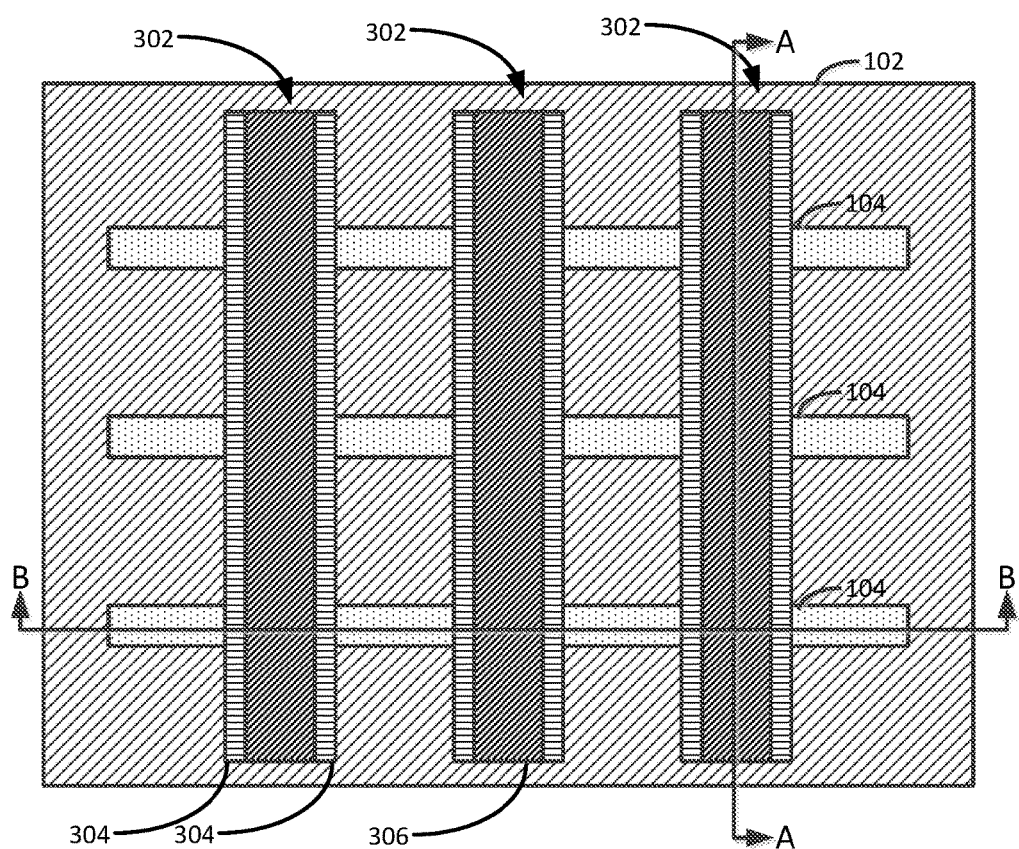
FIG. 3 illustrates a top view following the formation of dummy (sacrificial) gate stacks over the fins.

FIG. 3 illustrates a top view following the formation of dummy (sacrificial) gate stacks 302 over the fins 104. In this regard, the dummy gate stacks 302 are formed by, for example, depositing a layer of polysilicon or oxide over the substrate 102 and the fins 104 using, for example, a chemical vapor deposition, or plasma enhanced chemical vapor deposition process. A lithographic patterning and etching process such as, for example, reactive ion etching is performed to define the dummy gate stacks 302. Following the patterning of the dummy gate stacks 302, spacers 304 may be formed along the sidewalls of the dummy gate stacks 302. The spacers may be formed from, for example, an oxide or nitride material that is deposited over the dummy gate stacks 302 and exposed portions of the fins 104 and substrate 102. An anisotropic patterning and etching process is performed to define the spacers 304 along the sidewalls of the dummy gate stacks 302.

Figure 4:
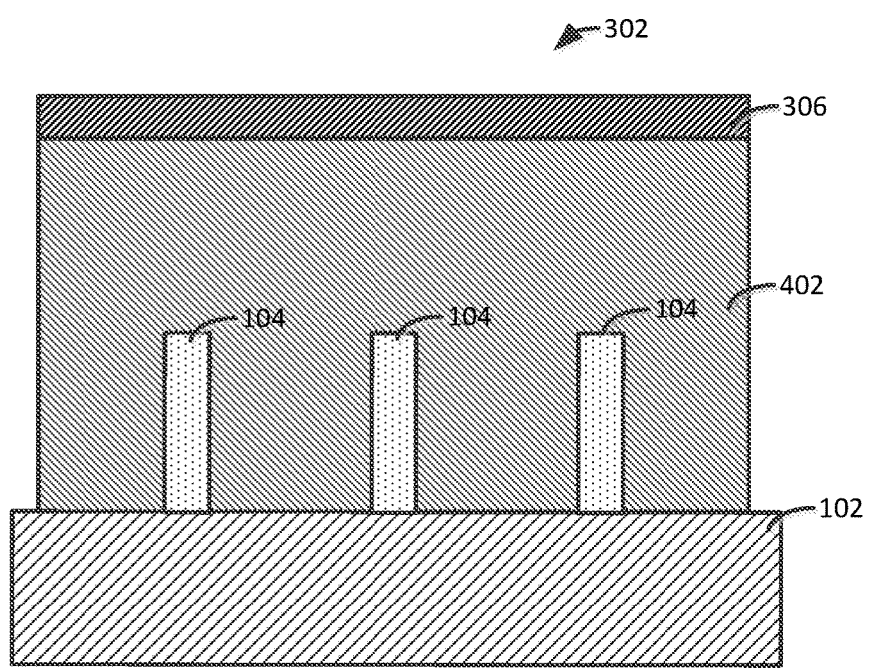
FIG. 4 illustrates a cutaway view along the line A-A of FIG. 3 of the dummy gate stack.
Figure 5:
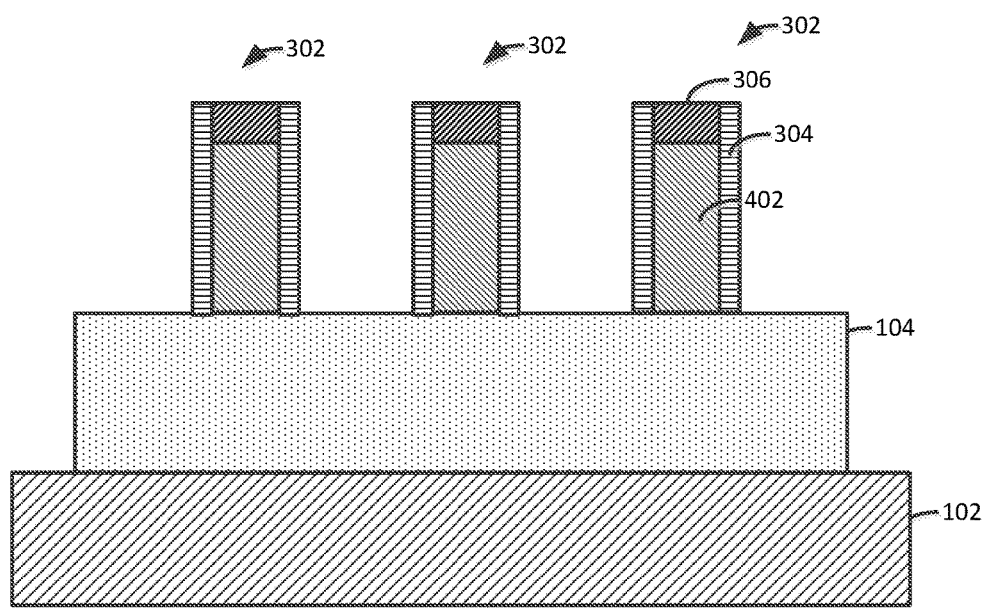
FIG. 5 illustrates a cutaway view along the line B-B of FIG. 3 of the dummy gate stacks.

FIG. 4 illustrates a cutaway view along the line A-A of FIG. 3 of the dummy gate stack 302. In the illustrated embodiment, a hardmask layer 306 is arranged on the dummy gate stack 302. The hardmask layer 306 is formed by depositing a layer of hardmask material over the layer of polysilicon prior to patterning the dummy gate stacks 302. Non-limiting examples of suitable materials for the hard mask layer 306 include silicon oxide, silicon nitride, or any combination thereof. FIG. 5 illustrates a cutaway view along the line B-B of FIG. 3 of the dummy gate stacks 302.

Figure 6:
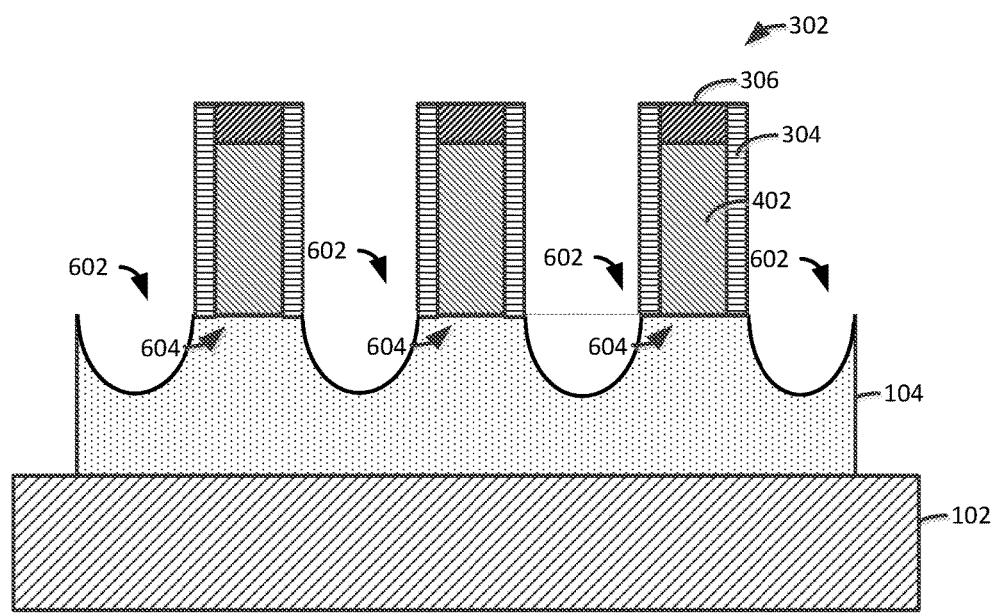
FIG. 6 illustrates a cutaway view similar to FIG. 5 following an etching process that selectively removes exposed portions of the fins.

FIG. 6 illustrates a cutaway view similar to FIG. 5 following an etching process that selectively removes exposed portions of the fins 104 such that cavities 602 are formed in the fins 104. An etching process such as Hbr may be used to recess the silicon material selectively with respect to $SiO_2$ and SiN of the hardmask layer 306 and spacers 304. The cavities 602 are formed to provide space for source/drain regions to be epitaxially grown, which will be described in further detail below.

The removal of portions of the fins 104 and the formation of the cavities 602 undesirably reduces (relaxes) the strain in the channel region 604 of the fins 104.

Figure 7:
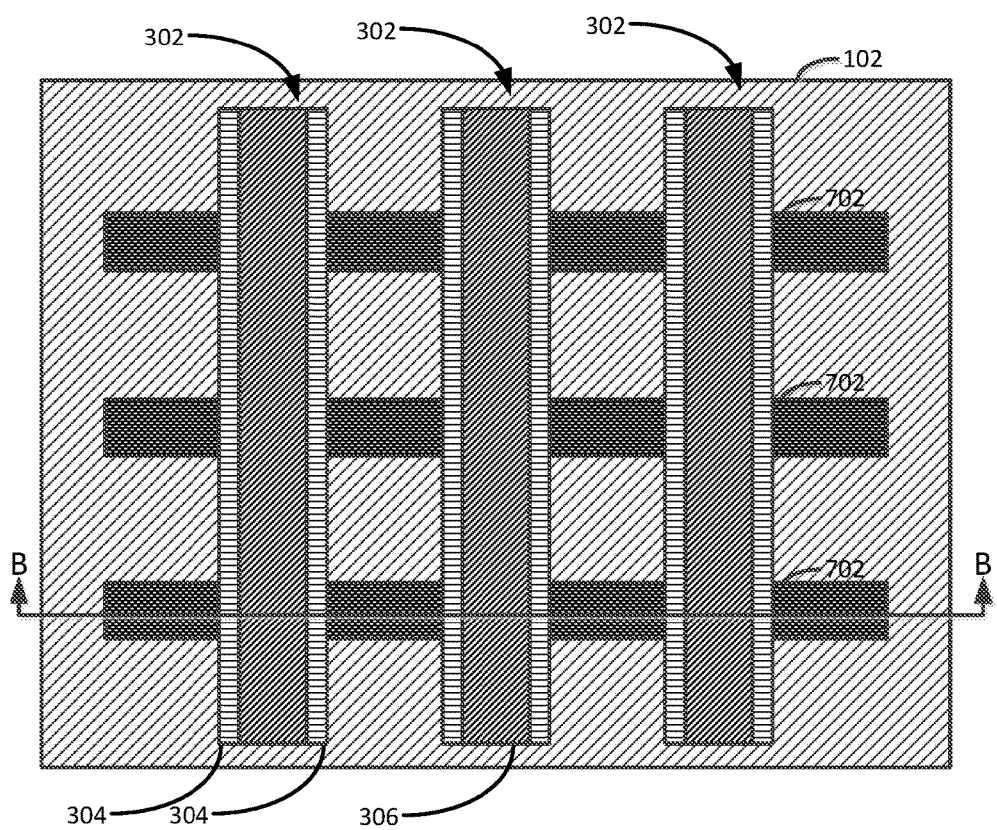
FIG. 7 illustrates a top view of the resultant structure following an epitaxial growth process.

FIG. 7 illustrates a top view of the resultant structure following an epitaxial growth process that is operative to form epitaxially grown semiconductor material on exposed portions of the fins 104 (of FIG. 6) to form source/drain regions 702. Generally, an epitaxial growth process is performed to deposit a crystalline layer onto a crystalline substrate beneath. The underlying substrate acts as a seed crystal. Epitaxial layers may be grown from gaseous or liquid precursors. Epitaxial silicon may be grown using vapor-phase epitaxy (VPE), molecular-beam epitaxy (MBE), liquid-phase epitaxy (LPE), or other suitable process. The epitaxial silicon, silicon germanium, and/or carbon doped silicon (Si:C) silicon can be doped during deposition by adding a dopant or impurity to form a silicide. The silicon may be doped with an n-type dopant (e.g., phosphorus or arsenic) or a p-type dopant (e.g., boron or gallium), depending on the type of transistor.

Figure 8:
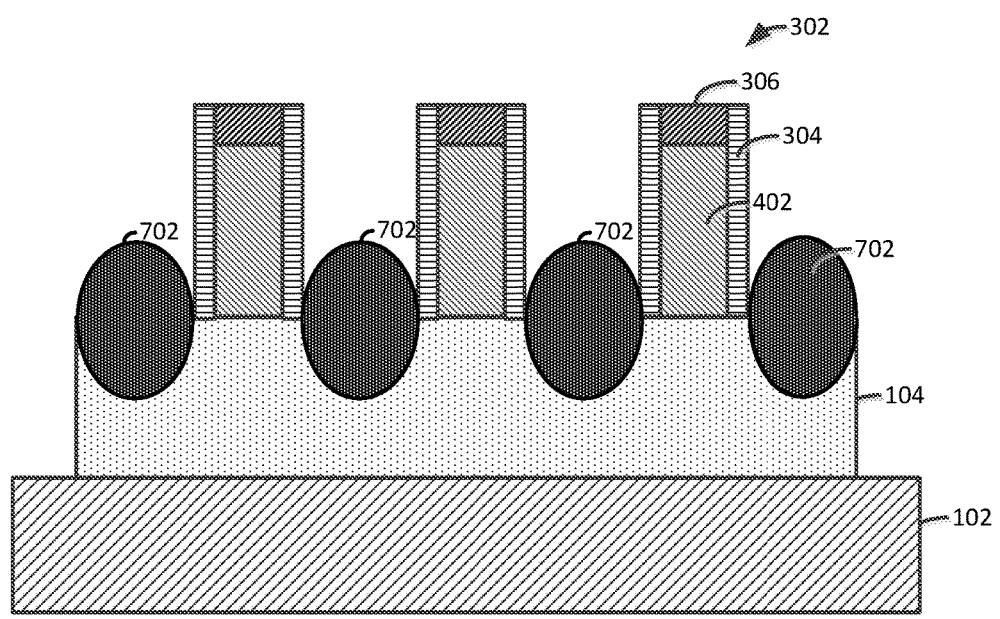
FIG. 8 illustrates a cutaway view along the line B-B of FIG. 7 showing the source/drain regions.

FIG. 8 illustrates a cutaway view along the line B-B of FIG. 7 showing the source/drain regions 702 arranged adjacent to the dummy gate stacks 302.

Figure 9:
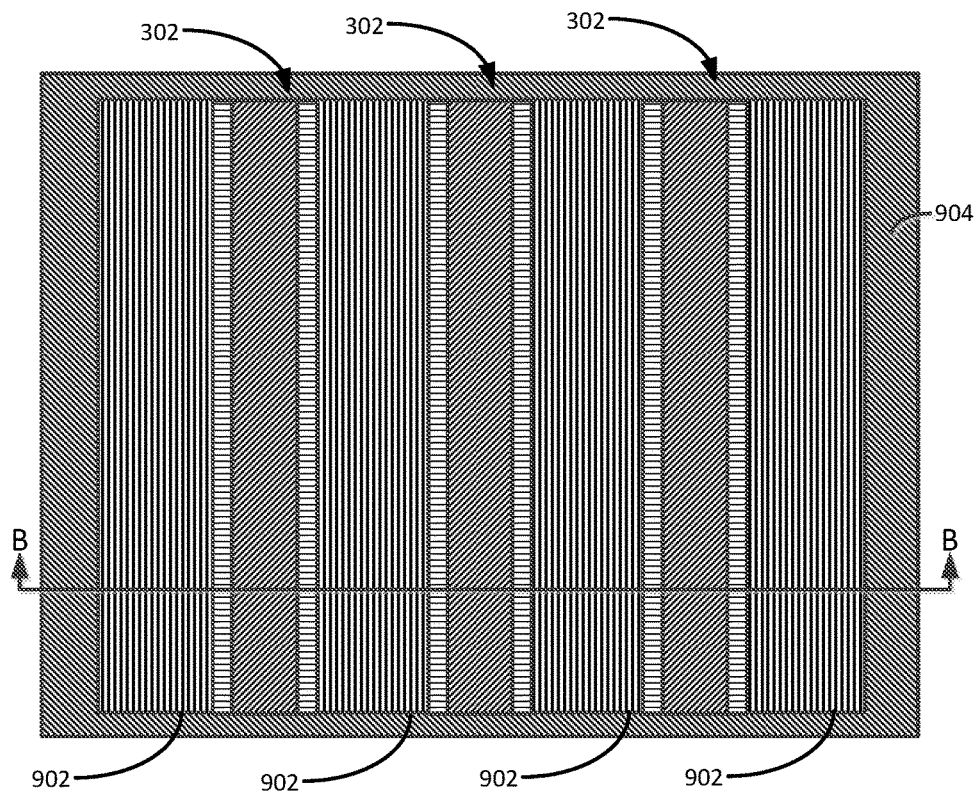
FIG. 9 illustrates a top view of the resultant structure following the formation of an insulator layer.

FIG. 9 illustrates a top view of the resultant structure following the formation of an insulator layer 904 and the formation of conductive contacts 902 over the source/drain regions 702. The contacts 902 may be formed by, for example, depositing a liner layer (not shown) followed by the deposition of a conductive material such as, for example, aluminum, copper, silver, or gold. Following the deposition of the conductive material, a planarization process, such as, for example, chemical mechanical polishing (CMP) may be performed to define the contacts 902.

Figure 10:
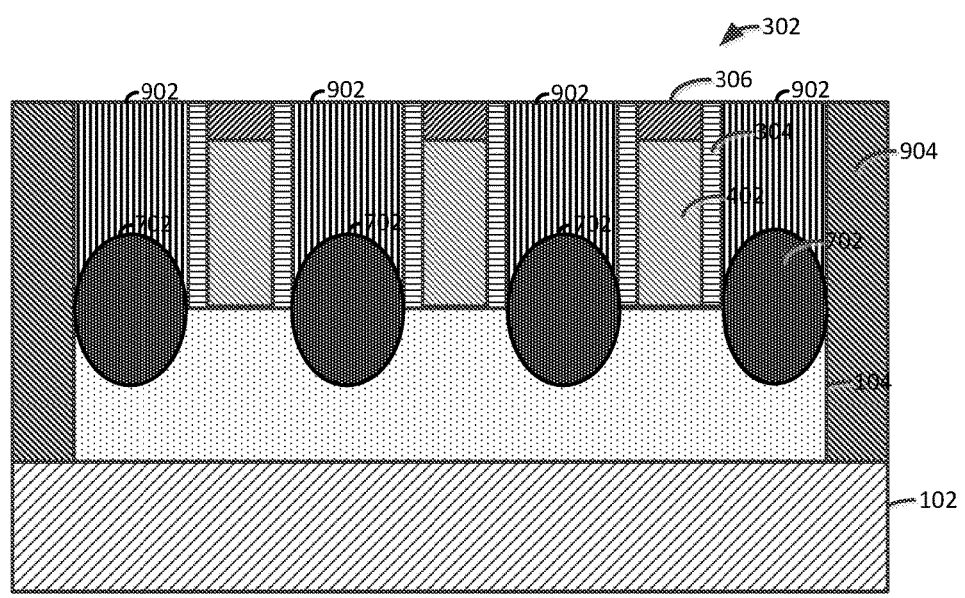
FIG. 10 illustrates a cutaway view along the line B-B of FIG. 9 showing the conductive contacts.

FIG. 10 illustrates a cutaway view along the line B-B of FIG. 9 showing the conductive contacts 902.

Figure 11:
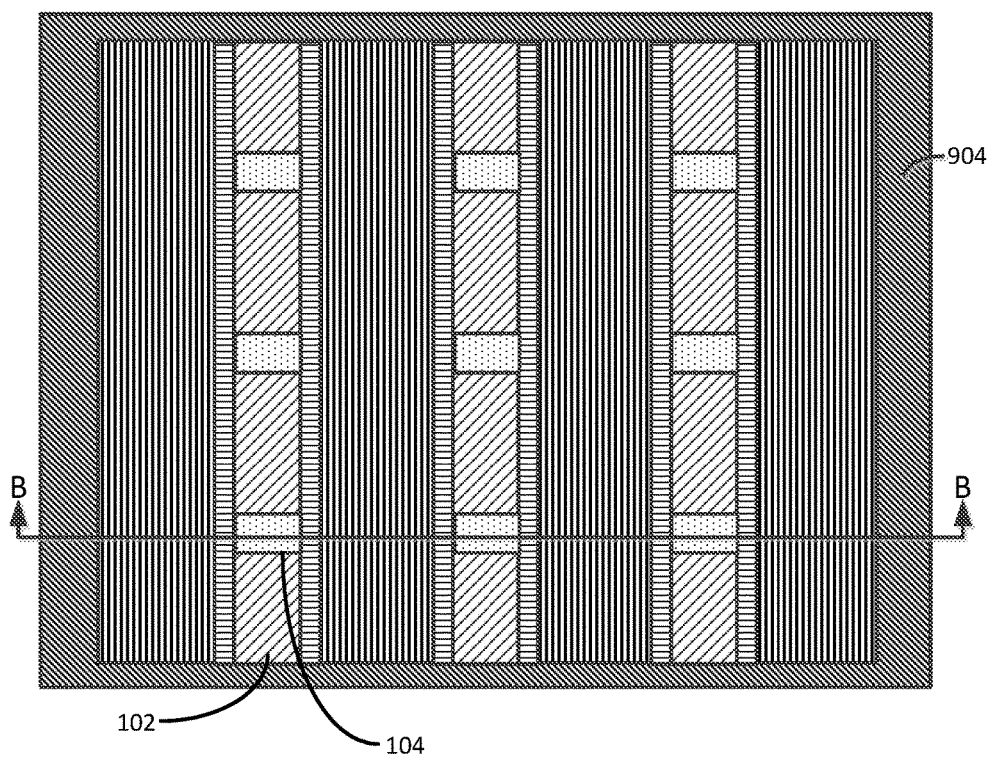
FIG. 11 illustrates a top view of the resultant structure following the removal of the dummy gate stacks.

FIG. 11 illustrates a top view of the resultant structure following the removal of the dummy gate stacks 302. The dummy gate stacks 302 are removed by, for example, a selective etching process that removes the dummy gate stacks 302 and exposes the underlying substrate 102 and the channel regions of the fins 104.

Figure 12:
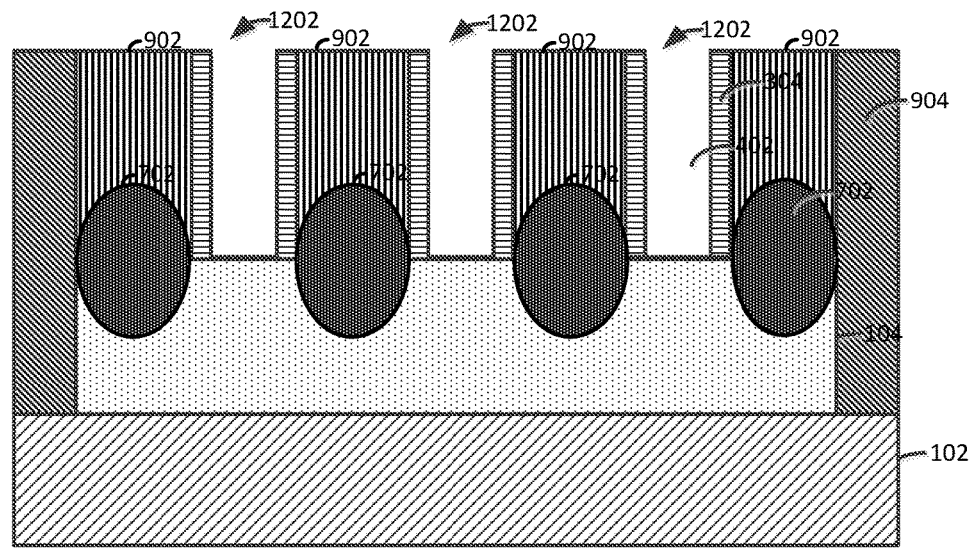
FIG. 12 illustrates a cutaway view along the line B-B of FIG. 11.

FIG. 12 illustrates a cutaway view along the line B-B of FIG. 11. FIG. 12 shows a cavity 1202 that is partially defined by the spacers 304 and the fin 104.

Figure 13:
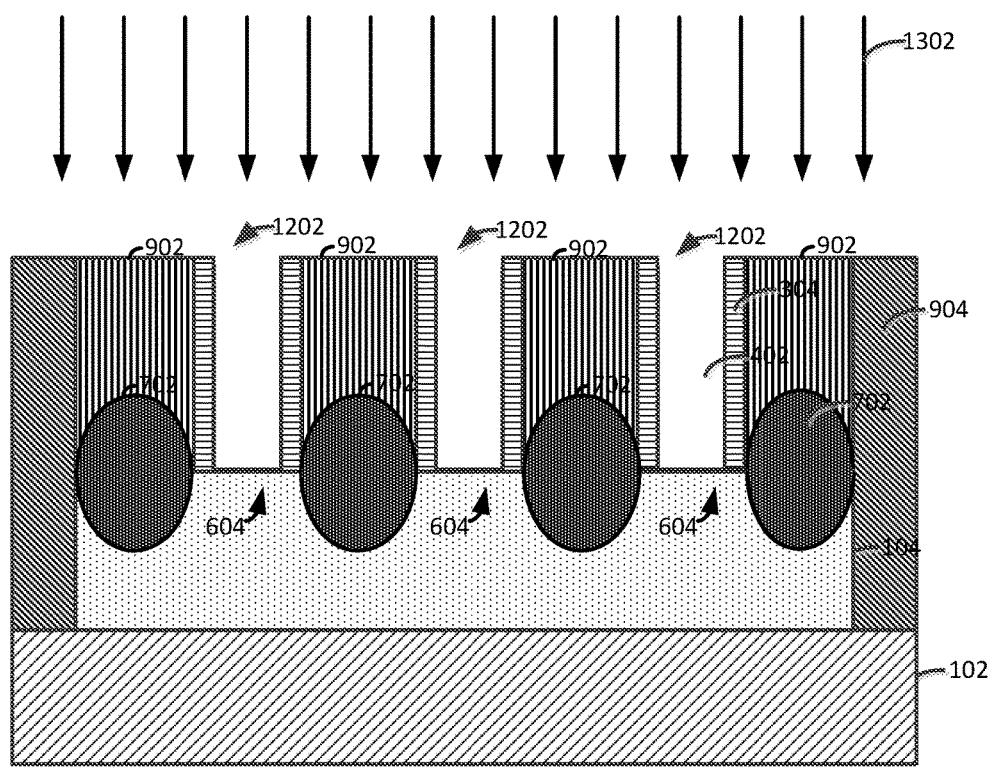
FIG. 13 illustrates a cutaway view similar to FIG. 12 during an ion implantation process.

FIG. 13 illustrates a cutaway view similar to FIG. 12 during an ion implantation process that implants germanium ions 1302 or other types of suitable ions that are operative to induce a strain into the channel region 602 of the fin 104. As discussed above, when the fins 104 are etched prior to forming the source/drain regions 702, the strain channel region 604 of the fin 104 is undesirably reduced. The implantation of the germanium ions into the channel region 604 followed by an aneling process increases the strain in the channel regions 604 of the fins 104 to improve the performance of the devices.

The ion implantation can be performed with, for example, a dose of 2E14 atoms/cm$^2$ to over 5E16 atoms/cm$^2$ with an energy appropriate to position the Ge substantially midway through the Fin using the top and bottom of the Fin as reference. After performing a spike annealing process to the wafer at 900 degrees Celsius or higher, alternatively the wafer can be annealed at a lower temperature such as, for example, about 600 degrees C. for a longer time of about 30 mins or greater. In an embodiment, the Ge distributes itself in a roughly uniform manner throughout the Fin from top to bottom.

Figure 14:
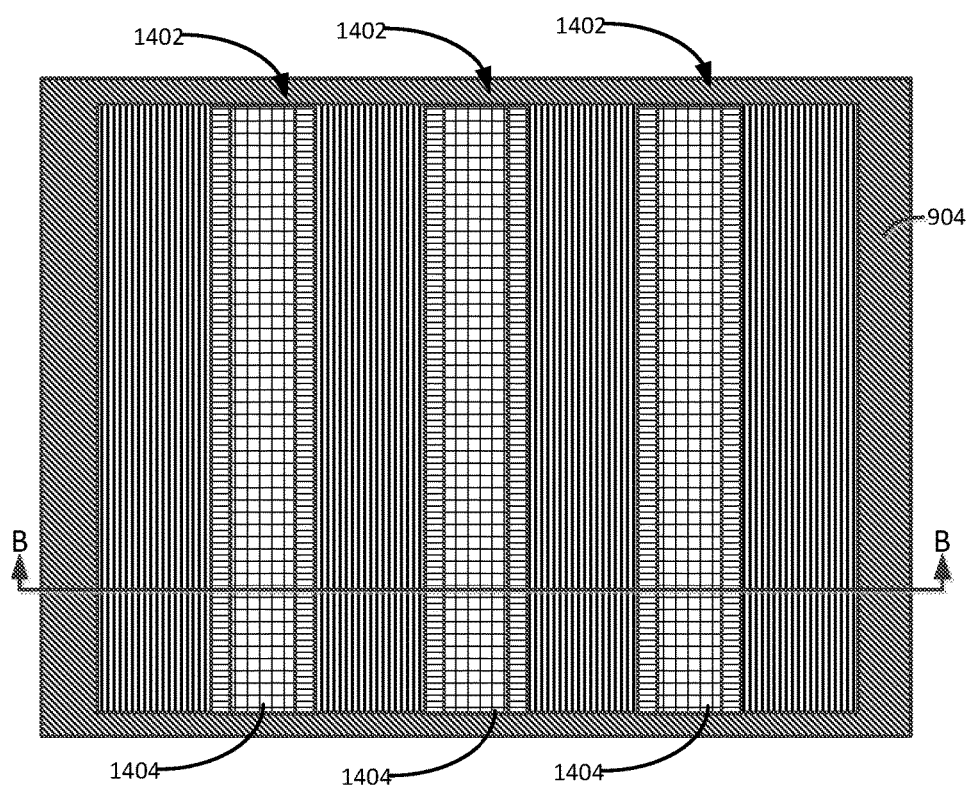
FIG. 14 illustrates a top view following the formation of replacement metal gate stacks over the channel regions.
Figure 15:
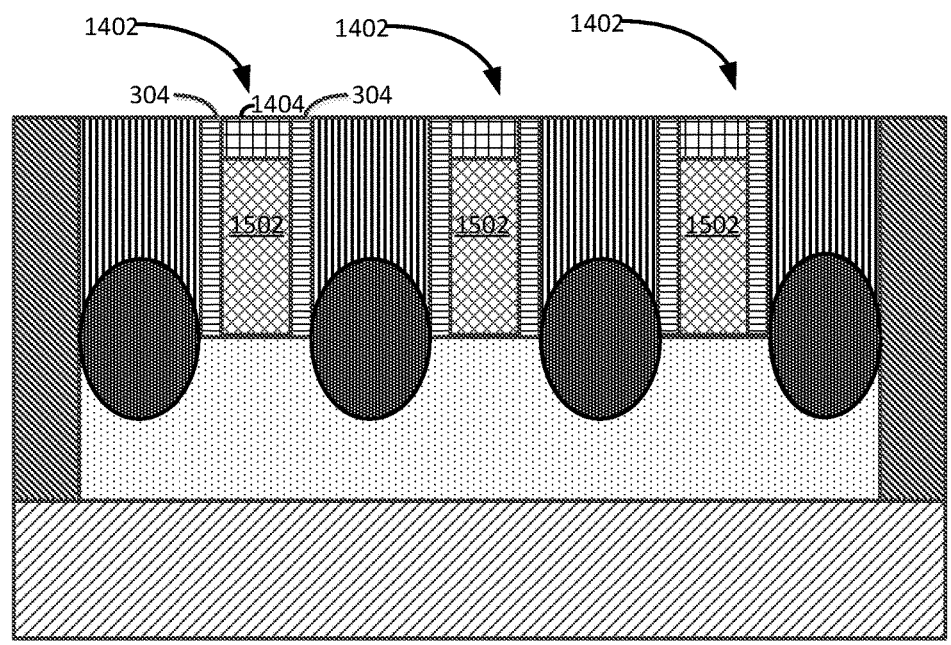
FIG. 15 illustrates a cutaway view along the line B-B of FIG. 14.

FIG. 14 illustrates a top view following the formation of replacement metal gate stacks 1402 over the channel regions 604 of the fins 104 and exposed portions of the substrate 102. The replacement metal gate stacks 1402 are capped with a capping layer 1402. FIG. 15 illustrates a cutaway view along the line B-B of FIG. 14.

The gate stacks 1402 include high-k metal gates formed, for example, by filling a dummy gate opening (not shown) with one or more high-k dielectric materials, one or more workfunction metals, and one or more metal gate conductor materials. The high-k dielectric material(s) can be a dielectric material having a dielectric constant greater than 4.0, 7.0, or 10.0. Non-limiting examples of suitable materials for the high-k dielectric material include oxides, nitrides, oxynitrides, silicates (e.g., metal silicates), aluminates, titanates, nitrides, or any combination thereof. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum.

The high-k dielectric material layer may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the high-k dielectric material may vary depending on the deposition process as well as the composition and number of high-k dielectric materials used. The high-k dielectric material layer may have a thickness in a range from about 0.5 to about 20 nm.

The work function metal(s) may be disposed over the high-k dielectric material. The type of work function metal(s) depends on the type of transistor and may differ between the NFET 101 and the PFET 102. Non-limiting examples of suitable work function metals include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof.

A conductive metal is deposited over the high-k dielectric material(s) and workfunction layer(s) to form the gate stacks. Non-limiting examples of suitable conductive metals include aluminum (Al), platinum (Pt), gold (Au), tungsten (W), titanium (Ti), or any combination thereof. The conductive metal may be deposited by a suitable deposition process, for example, CVD, PECVD, PVD, plating, thermal or e-beam evaporation, and sputtering.

A planarization process, for example, chemical mechanical planarization (CMP), is performed to polish the surface of the conductive gate metal.

Figure 16:
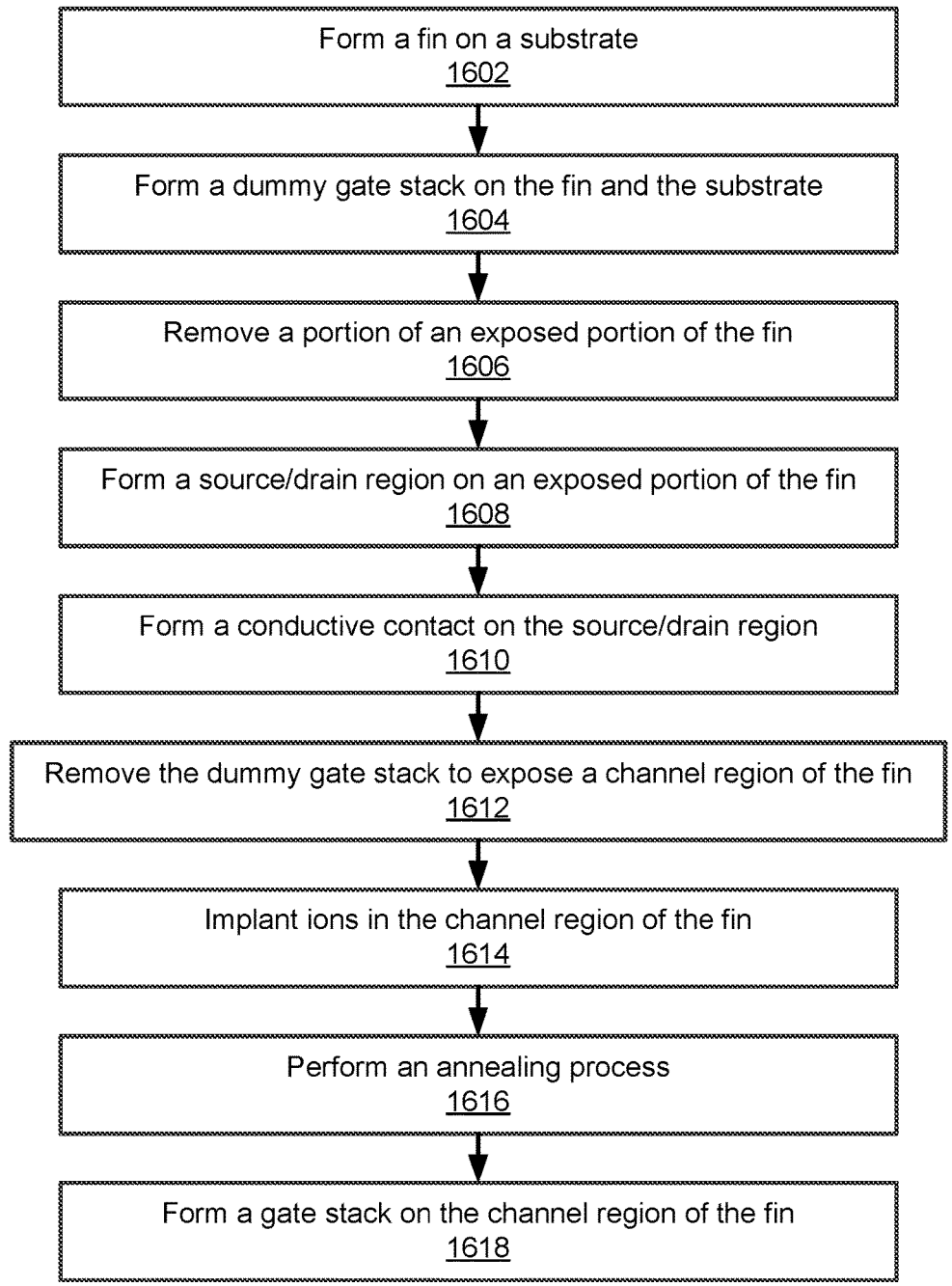
FIG. 16 illustrates a flow diagram of an exemplary method for fabricating a finFET device.

FIG. 16 illustrates a flow diagram of an exemplary method for fabricating a finFET device described above. In this regard, in block 1602, a fin is formed on the substrate. In block 1604, a dummy (sacrificial) gate is formed over the fin and on the substrate. A portion of an exposed fin is removed in block 1606. In block 1608, source/drain regions are formed on an exposed portion of the fin. A conductive contact is formed on the source/drain regions in block 1610. In block 1612, the dummy gate stack is removed to expose a channel region of the fin. Ions are implanted in the channel region of the fin in block 1614. In block 1616, an annealing process is performed. In block 1618, a gate stack is formed on the channel region of the fin.

Figure 17:
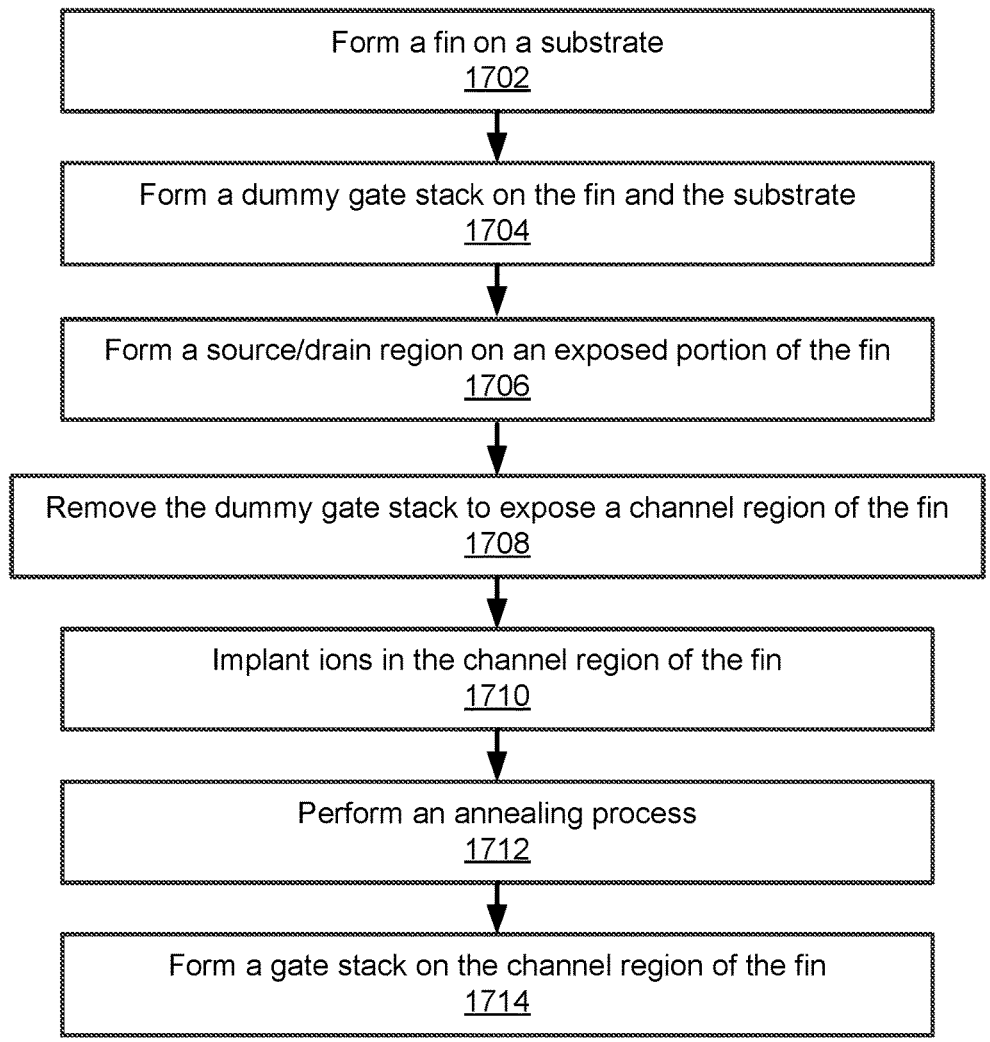
FIG. 17 illustrates a flow diagram of another exemplary method for fabricating a finFET device.

FIG. 17 illustrates a flow diagram of another exemplary method for fabricating a finFET device as described above. In this regard, in block 1702, a fin is formed on the substrate. In block 1704, a dummy (sacrificial) gate is formed over the fin and on the substrate. In block 1706, source/drain regions are formed on an exposed portion of the fin. In block 1708, the dummy gate stack is removed to expose a channel region of the fin. Ions are implanted in the channel region of the fin in block 1710. In block 1712, an annealing process is performed. In block 1714, a gate stack is formed on the channel region of the fin.

The embodiments described above provide for a finFET having a strained channel region with strain partially induced by implanting and annealing ions in the channel regions of the device prior to forming replacement metal gate stacks.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
   a fin arranged on a substrate, the fin comprising a semiconductor material having a cavity formed in a surface of the fin opposite the substrate, the cavity adjacent to a channel region of the fin;
   a gate stack arranged over the channel region of the fin, wherein the channel region of the fin includes implanted germanium ions that are operative to induce a strain in the channel region of the fin; and
   a source/drain region arranged on the fin adjacent to the gate stack, a portion of the source/drain region filling the cavity.

2. The device of claim 1, wherein the fin comprises a patterned silicon material having a cavity that is filled with epitaxially grown semiconductor material.

3. The device of claim 1, wherein the source/drain region includes a patterned semiconductor material that has a cavity filled with a crystalline semiconductor material.

4. The device of claim 1, wherein the fin comprises a semiconductor material having a cavity adjacent to the channel region, the cavity filled with a crystalline semiconductor material.

5. The device of claim 1, wherein the fin comprises a semiconductor material.

6. The device of claim 1, wherein the fin comprises a silicon material.

7. The device of claim 1, wherein the source/drain region includes a cavity defined by the fin.

8. The device of claim 1, further comprising a spacer arranged adjacent to the gate stack.

9. The device of claim 1, wherein the substrate includes an insulator layer, and the fin is arranged on the insulator layer.

* * * * *